US012562548B2

(12) United States Patent
Itamoto

(10) Patent No.: US 12,562,548 B2
(45) Date of Patent: Feb. 24, 2026

(54) OPTICAL SEMICONDUCTOR DEVICE

(71) Applicant: Mitsubishi Electric Corporation, Tokyo (JP)

(72) Inventor: Hiromitsu Itamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 566 days.

(21) Appl. No.: 18/005,029

(22) PCT Filed: Oct. 20, 2020

(86) PCT No.: PCT/JP2020/039317
§ 371 (c)(1),
(2) Date: Jan. 10, 2023

(87) PCT Pub. No.: WO2022/085062
PCT Pub. Date: Apr. 28, 2022

(65) Prior Publication Data
US 2023/0253758 A1     Aug. 10, 2023

(51) Int. Cl.
H01S 5/022 (2021.01)
H01S 5/042 (2006.01)

(52) U.S. Cl.
CPC .............. H01S 5/042 (2013.01); H01S 5/022 (2013.01)

(58) Field of Classification Search
CPC ...... G02F 1/015; H01S 5/022; H01S 5/02345; H01S 5/0261; H01S 5/0265; H01S 5/042; H01S 5/0427; H01S 5/06825
(Continued)

(56) References Cited

U.S. PATENT DOCUMENTS

2005/0067698 A1* 3/2005 Aruga .................. H01S 5/0427
257/737
2012/0092743 A1 4/2012 Okada
(Continued)

FOREIGN PATENT DOCUMENTS

JP     H04-188652 A     7/1992
JP     H04-298106 A     10/1992
JP     2012-088348 A     5/2012

OTHER PUBLICATIONS

International Search Report issued in PCT/JP2020/039317; mailed Dec. 15, 2020.

*Primary Examiner* — Timothy J Thompson
*Assistant Examiner* — Guillermo J Egoavil
(74) *Attorney, Agent, or Firm* — Studebaker Brackett PLLC

(57) ABSTRACT

Provided here are: a sub-mount board that is provided with, on its front surface, a GND pattern, a capacitor mounting pattern and a signal line, and is provided with, on its back surface, a GND pattern; a light modulation element that is bonded to the surface of the GND pattern; a matching capacitor whose back surface is bonded to the surface of the capacitor mounting pattern and whose front surface is connected through a wire to a front surface electrode of the light modulation element; a matching resistor that makes a connection between the capacitor mounting pattern and the GND pattern; and a protective resistor that makes a connection between the signal line and the GND pattern across the sub-mount board in a board thickness direction, the signal line being connected through a wire to the front surface electrode of the light modulation element. Accordingly, the sub-mount board is small-sized.

16 Claims, 12 Drawing Sheets

(58) Field of Classification Search
USPC ......................................................... 372/38.1
See application file for complete search history.

(56)                     References Cited

U.S. PATENT DOCUMENTS

| 2018/0092171 | A1* | 3/2018 | Zhao | ..................... H05B 45/395 |
| 2018/0302965 | A1* | 10/2018 | Petersen | ................ H05B 45/37 |
| 2020/0092014 | A1* | 3/2020 | de Rochemont | ........ H03H 7/06 |
| 2021/0057877 | A1* | 2/2021 | Hirayama | ............. H01S 5/0261 |
| 2021/0336701 | A1* | 10/2021 | Noguchi | ................ H05K 1/113 |
| 2021/0359488 | A1* | 11/2021 | Kagaya | ................ G02F 1/0157 |

* cited by examiner

OPTICAL SEMICONDUCTOR DEVICE

TECHNICAL FIELD

The present application relates to an optical semiconductor device.

BACKGROUND ART

In order to reduce power consumption, conventional optical semiconductor devices employ a structure in which a capacitor is interposed between a light-emitting element and the ground (GND). In these cases, a protective resistor is connected in parallel to the capacitor in order to prevent charging of electric charges (see, for example, Patent Document 1).

CITATION LIST

Patent Document

Patent Document 1: Japanese Patent Application Laid-open No. 2012-88348 (Paragraph 0010; FIG. 1)

SUMMARY OF THE INVENTION

Problems to be Solved by the Invention

However, for employing such a structure, a sub-mount board therefor is required to have an area for providing the protective resistor and thus, there is a problem that it is difficult to downsize the sub-mount board while ensuring the area for providing the protective resistor.

This application discloses a technique for solving the problem as described above, and an object thereof is to provide an optical semiconductor device provided with a sub-mount board that is small-sized while having the protective resistor.

Means for Solving the Problems

An optical semiconductor device disclosed in this application is characterized by comprising: a board that is provided with, on its front surface, a first GND pattern, a first conductive pattern and a second conductive pattern, and is provided with, on its back surface, a second GND pattern; a light-emitting element that is bonded to a surface of the first GND pattern; a capacitor whose back surface is bonded to a surface of the second conductive pattern, and whose front surface is connected through a first wire to a front surface electrode of the light-emitting element; a first resistor that makes a connection between the second conductive pattern and the first GND pattern; and a second resistor that makes a connection between the first conductive pattern and the second GND pattern across the board in a board thickness direction, said first conductive pattern being connected through a second wire to the front surface electrode of the light-emitting element.

Effect of the Invention

According to this application, the sub-mount board can be small-sized while having the protective resistor.

MODES FOR CARRYING OUT THE INVENTION

Embodiment 1

With the progress of wavelength multiplexing for optical semiconductor devices, such optical semi-conductor devices are increasing in which multiple light-emitting elements 1 are mounted per one optical semiconductor device. In Embodiment 1, a case will be described where two light-emitting elements 1 are mounted in one optical semiconductor device.

Figure 1:
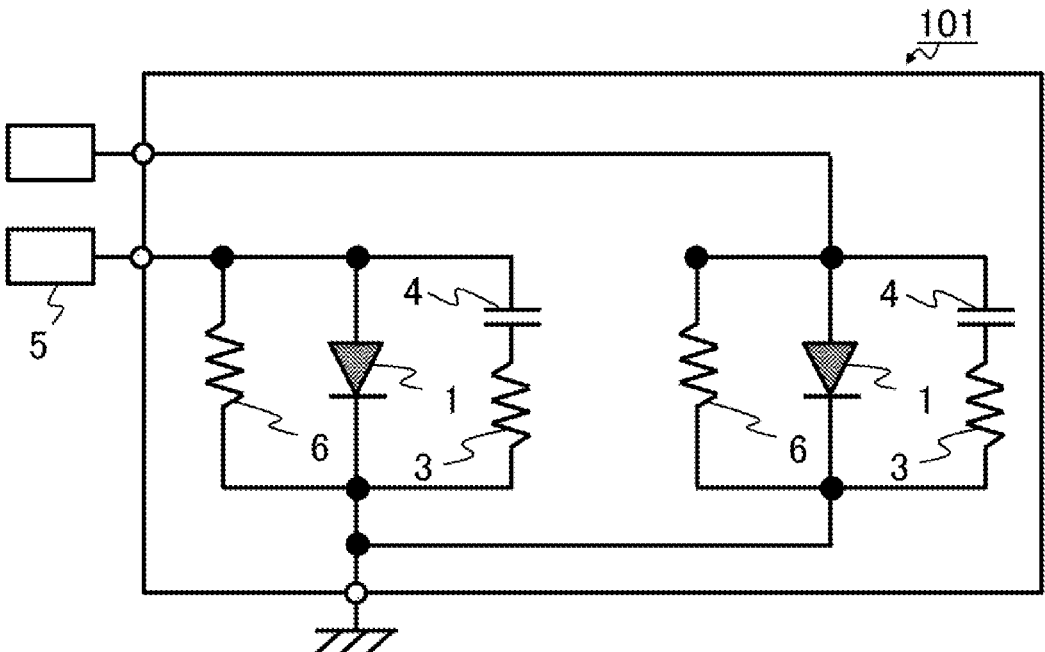
FIG. 1 is an equivalent circuit diagram showing an electrical configuration of an optical semiconductor device according to Embodiment 1.

FIG. 1 is an equivalent circuit diagram showing an electrical configuration of an optical semiconductor device 101 according to Embodiment 1 of this application. As shown in FIG. 1, the optical semiconductor device 101 is a TOSA (Transmitter Optical Sub-Assembly), and has the light-emitting elements 1, matching resistors 3 each as a first resistor, capacitors 4, and protective resistors 6 each as a second resistor. The anode of the light-emitting element 1 is connected to a driver circuit 5 and the cathode thereof is connected to the GND. The matching resistor 3 and the capacitor 4 are, and the protective resistor 6 is, connected in parallel to the light-emitting element 1. The light-emitting element 1 is, for example, an EML-LD (Electro-absorption Modulator Laser Diode). The light-emitting element 1 emits light in response to a high-frequency modulated electric signal supplied from the driver circuit 5. Note that the matching resistor 3 and the capacitor 4 may be arranged in this order from the driver circuit 5-side.

Figure 2A:
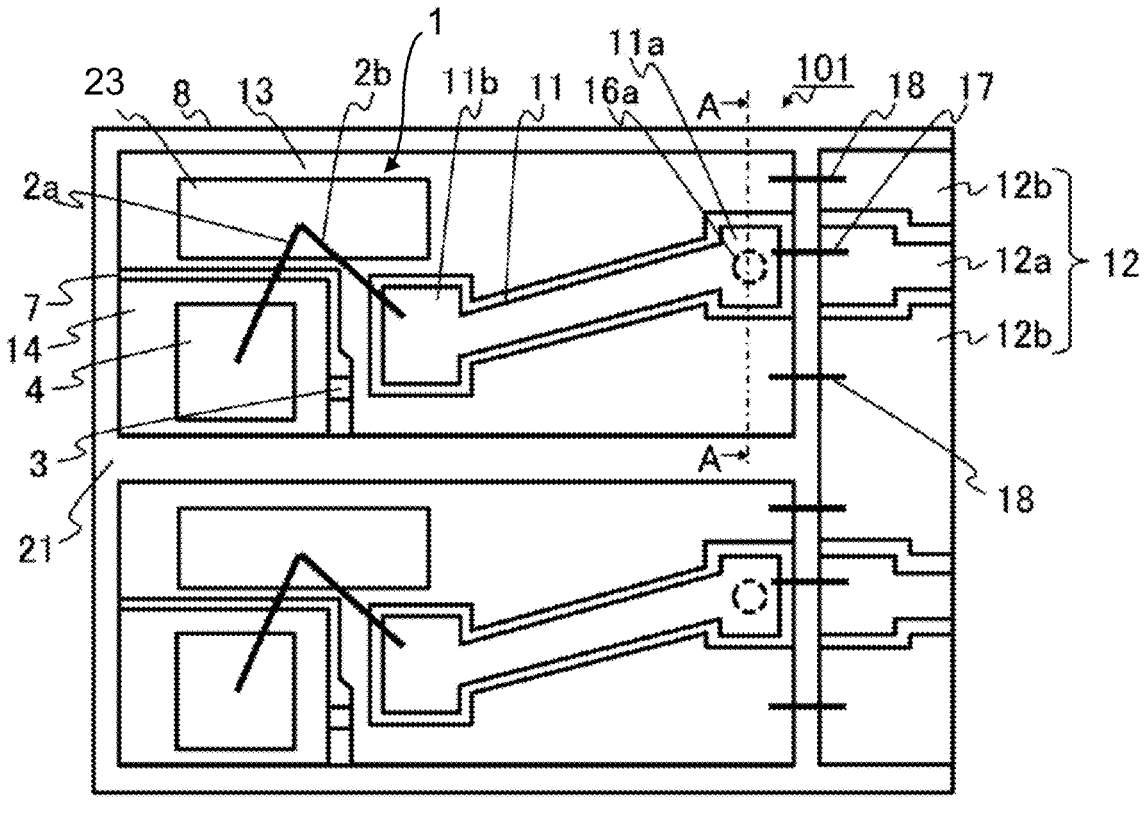
FIG. 2A and FIG. 2B are is a set of plan view and cross-sectional view showing a configuration of the optical semi-conductor device according to Embodiment 1.
Figure 2B:
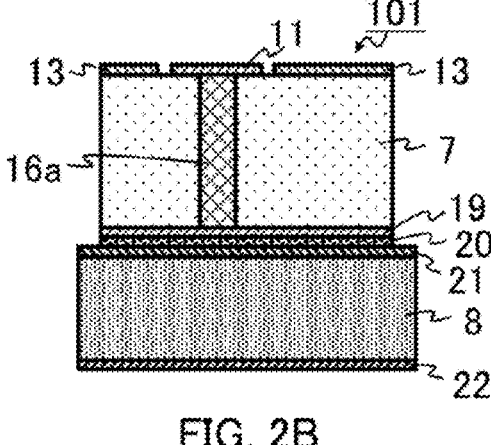

FIG. 2A and FIG. 2B are diagrams showing a configuration of the optical semiconductor device 101 according to Embodiment 1 of this application. FIG. 2A is a plan view and FIG. 2B is an AA arrow cross-sectional view in FIG. 2A. As shown in FIG. 2A and FIG. 2B, in the optical semiconductor device 101, sub-mount boards 7 are provided on a carrier board 8. The carrier board 8 is made of, for example, CuW, and the sub-mount board 7 is made of, for example, AlN. Conductive patterns 21, 22 are provided on both surfaces of the carrier board 8. A second GND pattern 19 is provided on the back surface of the sub-mount board 7. The conductive pattern 21 of the carrier board 8 and the second GND pattern 19 of the sub-mount board 7 are bonded to each other using a solder or the like 20. A first conductive pattern 11 and a first GND pattern 13 that are separated from each other, are provided on the front surface of the sub-mount board 7. Note that gold plating is applied to the surfaces of the first conductive pattern 11 and the first GND pattern 13. Further, even though not mounted in Embodiment 1, a light-receiving element may also be mounted.

With respect to the light-emitting element 1, a back surface electrode (not illustrated) of the light-emitting element 1 is bonded to the first GND pattern 13 formed on the front surface of the sub-mount board 7, by using a solder or the like. A front surface electrode (not illustrated) 23 of the light-emitting element 1 is bonded to a front surface electrode (not illustrated) of the capacitor 4 and to the first conductive pattern 11 through a wire 2a as a first wire and a wire 2b as a second wire, respectively.

With respect to the capacitor 4, a back surface electrode (not illustrated) of the capacitor 4 is bonded to a second conductive pattern 14 formed on the front surface of the sub-mount board 7, by using a solder or the like. The front surface electrode (not illustrated) of the capacitor 4 is connected to the front surface 23 of the light-emitting element 1 through the wire 2a. The second conductive pattern 14 on which the capacitor 4 is mounted and the first GND pattern 13 are interconnected by way of the matching resistor 3, so that the capacitor is connected in parallel to the light-emitting element 1 and in series to the matching resistor 3.

The matching resistor 3 makes a connection between the second conductive pattern 14 on which the capacitor 4 is mounted and the first GND pattern 13 to which the light-emitting element 1 is bonded, and is connected in parallel to the light-emitting element 1. In order to achieve impedance matching, the resistance value of the matching resistor 3 is set to 50Ω; however, it may be changed from 50Ω for the purpose of fine adjustment of characteristics.

The optical semiconductor device 101 according to Embodiment 1 of this application is characterized in that the protective resistor 6 is configured as a second resistor 16a made of a resistive material filled in a hole. As shown in FIG. 2A and FIG. 2B, the second resistor 16a is formed in such a manner that a resistive paste, for example, is filled in the hole created in the sub-mount board 7. The second resistor 16a as the thus-filled resistive material penetrates through the sub-mount board 7 to thereby make a connection between:

a terminal portion 11a for external connection in the first conductive pattern 11 that is connected through the wire 2b to the front surface electrode 23 of the light-emitting element 1, said terminal portion being located near a side surface of the sub-mount board 7; and the second GND pattern 19 formed on the back surface of the sub-mount board 7;

so that the second resistor is connected in parallel to the light-emitting element 1 and to the matching resistor 3 and the capacitor 4.

Accordingly, electric charges are not charged in the front surface electrode of the capacitor 4 and can be released through the second resistor 16a as the filled resistive material to the second GND pattern 19 on the back surface of the sub-mount board 7.

The first conductive pattern 11 is connected using a wire 17 to a modulated electric-signal wiring line 12a. The first GND pattern 13 is connected using wires 18 to GND wiring lines 12b. Note that the GND wiring lines 12b are provided on both sides of the modulated electric-signal wiring line 12a, and the first GND pattern 13 is provided extending to both sides of the first conductive pattern 11, and they each constitute a coplanar waveguide. The modulated electric-signal wiring line 12a and the first conductive pattern 11 transfer the modulated electric signal coming from the driver circuit 5. Note that the wires 2a, 2b, 17, 18 are each a gold wire, for example; however, it may instead be a ribbon-shaped gold line or the like.

Figure 3A:
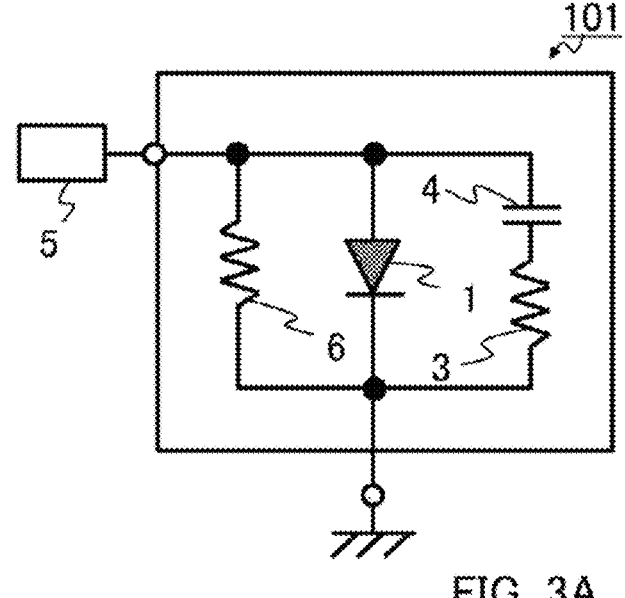
FIG. 3A and FIG. 3B are is a set of equivalent circuit diagram and plan view showing another configuration of the optical semiconductor device according to Embodiment 1.
Figure 3B:
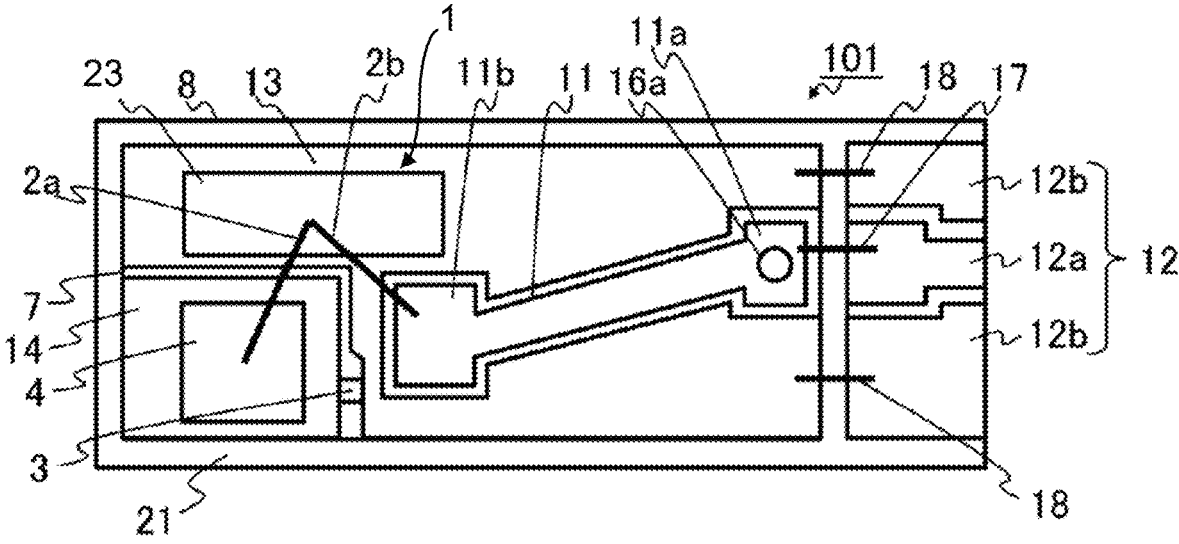

It is noted that, in Embodiment 1, a case is shown where two light-emitting elements are mounted; however, this is not limitative. The number of the light-emitting elements 1 may be one or may be three or more. In FIG. 3A and FIG. 3, an exemplary optical semiconductor device 101 in the case where one light-emitting element is mounted therein is shown. FIG. 3A is its equivalent circuit diagram and FIG. 3B is its plan view.

It is further noted that, in Embodiment 1, the second resistor 16a is provided at the terminal portion 11a for external connection in the first conductive pattern 11; however, this is not limitative.

Figure 4A:
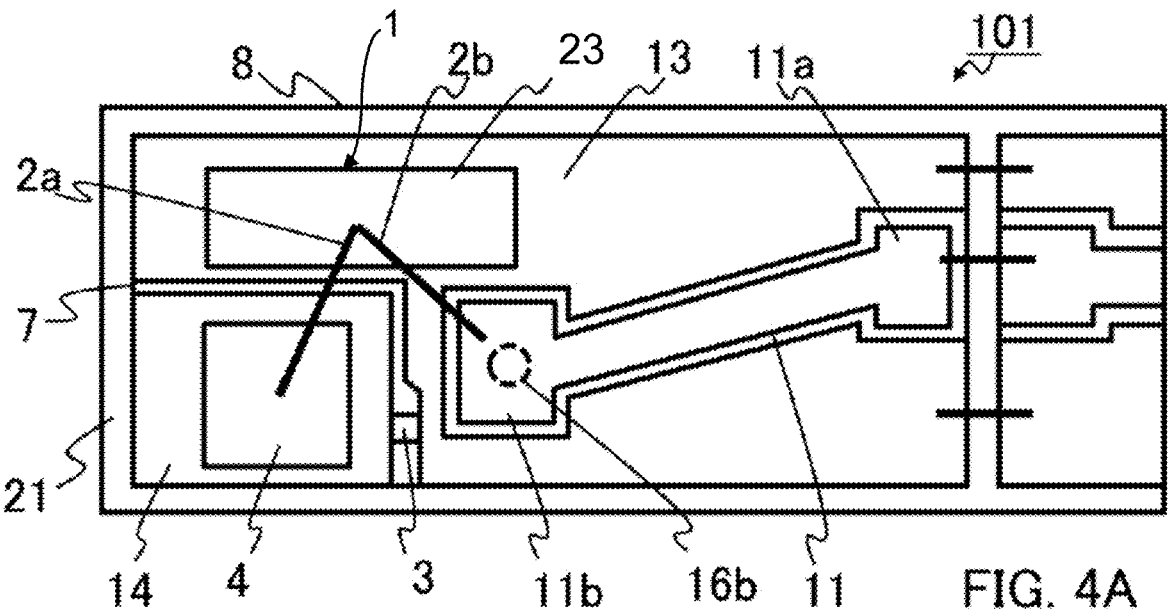
FIG. 4A and FIG. 4B are is a set of plan views each showing another configuration of the optical semiconductor device according to Embodiment 1.
Figure 4B:
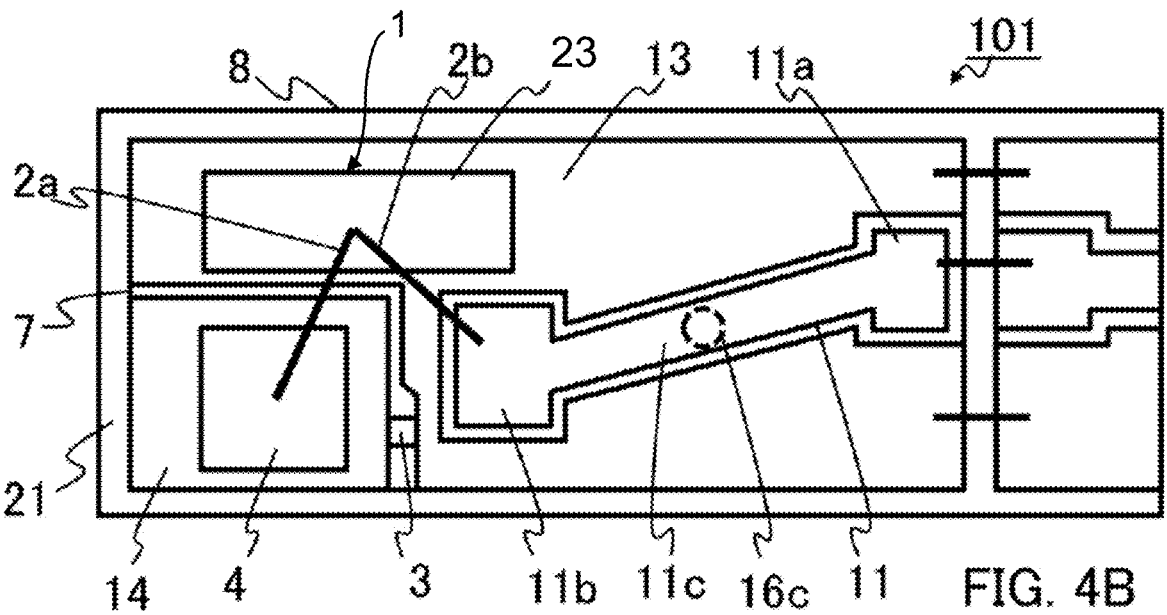

As shown in FIG. 4A, it may instead be a second resistor 16b which is provided at a terminal portion 11b for connection to the light-emitting element 1. Further, as shown in FIG. 4B, it may instead be a second resistor 16c which is provided at an interconnection portion 11c in the first conductive pattern 11 between the terminal portion 11b for connection to the light-emitting element 1 and the terminal portion 11a for external connection. It is particularly noted that the terminal portions 11a, 11b for these connections, which constitute both ends of the first conductive pattern 11, each have an enlarged pattern area in order to create a capacitance component for cancelling out the inductance component of the wire. This makes it possible to easily establish the connection between the second resistor 16a or 16b and the first conductive pattern 11, and thus an effect of improving ease of manufacture may also be achieved.

Figure 5:
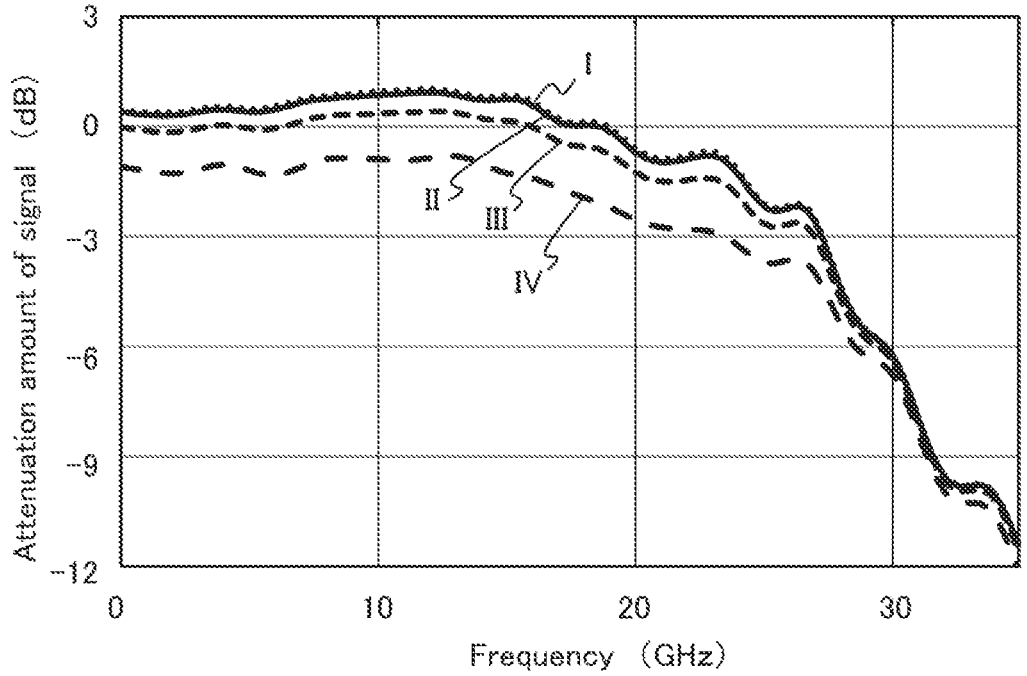
FIG. 5 is a graph showing a relationship between an attenuation amount and a frequency.

In Embodiment 1, the second resistor 16a is used as the protective resistor 6, so that, in FIG. 5, a simulation result is shown that represents relationships between an attenuation amount of a signal and a frequency thereof when the resistance value of the resistive material filled as the second resistor 16a is varied. In this simulation, the resistance value of the matching resistor 3 was set to 50Ω and the capacitance of the capacitor 4 was set to 10 nF. The abscissa represents the frequency of a signal inputted to the optical semiconductor device 101. The ordinate represents the attenuation amount of the signal during its transfer by the optical semiconductor device 101. Line I, Line II, Line III and Line IV represent results when the resistance value of the second resistor 16a is 2.1 kΩ, 1.1 kΩ, 0.3 kΩ and 0.1 kΩ, respectively. For example, when the ordinate value is −3 dB, the intensity of the signal is halved. The attenuation amount at 0 GHz varies depending on the resistance value, and as the resistance value becomes smaller, the varying amount becomes larger.

Figure 6:
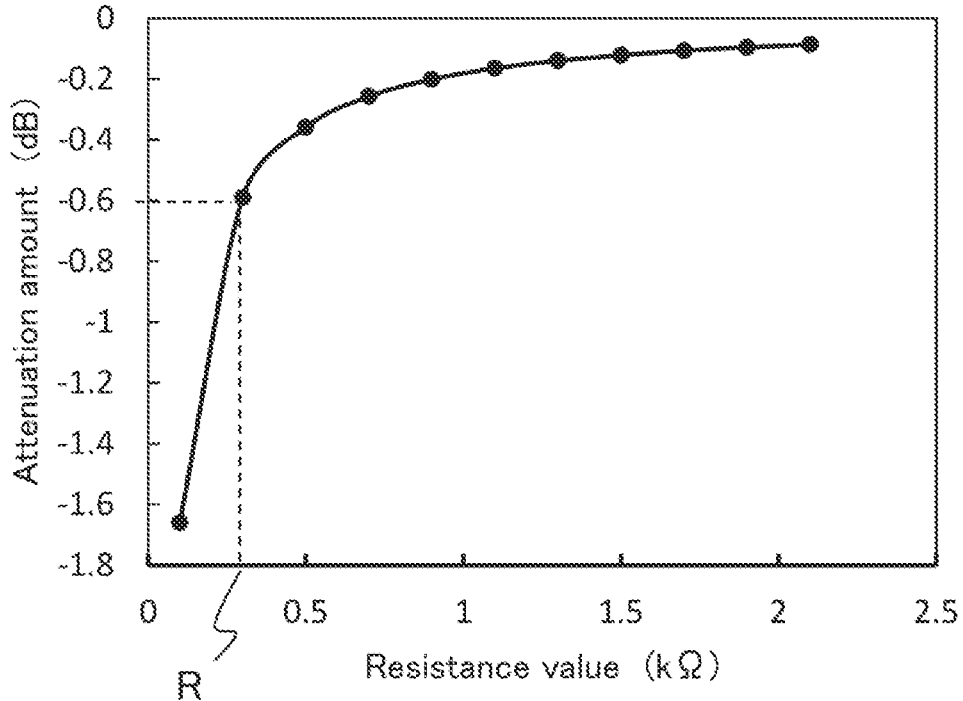
FIG. 6 is a graph showing a relationship between an attenuation amount and a resistance value.

FIG. 6 is a simulation result that represents a relationship between the attenuation amount of a signal at 0 GHz and the resistance value of the resistive material filled as the second resistor 16a, when the resistance value is varied. The abscissa represents the resistance value of the resistive material filled as the second resistor 16a. The ordinate represents the attenuation amount of the signal at 0 GHz during its transfer by the optical semi-conductor device 101. There is a tendency that the smaller the resistance value, the larger the attenuation amount. Accordingly, in order to achieve intended characteristics, it is preferable that the resistance value be 0.3 kΩ or more.

Figure 7:
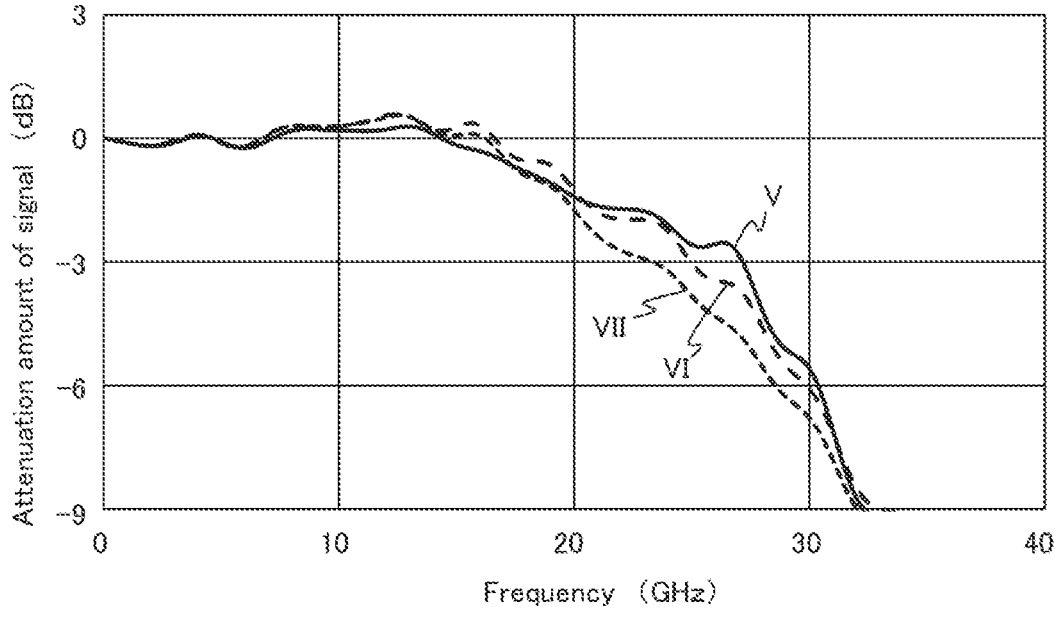
FIG. 7 is a graph showing a relationship between an attenuation amount and a frequency.

FIG. 7 is a simulation result that represents a relationship between the attenuation amount of a signal and a frequency thereof, in each of the cases of: the second resistor 16a (whose resistance value is 0.1 kΩ) that is provided at the terminal portion 11a for external connection in the first conductive pattern 11; the second resistor 16b (whose resistance value is 0.1 kΩ) that is provided at the terminal portion 11b for connection to the light-emitting element 1; and the second resistor 16c (whose resistance value is 0.1 kΩ) that is provided at the interconnection portion 11c in the first conductive pattern 11 between the terminal portion 11b for connection to the light-emitting element 1 and the terminal portion 11a for external connection. In this simulation, the resistance value of the matching resistor 3 was set to 50Ω and the capacitance of the capacitor 4 was set to 10 nF. The abscissa represents the frequency of a signal inputted to the optical semiconductor device 101. The ordinate represents the attenuation amount of the signal during its transfer by the optical semiconductor device 101. Line V, Line VI and Line VII represent results in the cases of the second resistor 16a, the second resistor 16b and the second resistor 16c, respectively. It has been confirmed from FIG. 7 that, although the second resistor 16a and the second resistor 16b that are located at the terminal portions in the first conductive pattern 11 have mutually equivalent characteristics, the second resistor 16c that is located in the middle of the first conductive pattern 11 shows large attenuation amounts in a high-frequency range of 20 GHz or more, so that, when the second resistor is located at one of the terminal portions in the first conductive pattern 11, the high frequency performance is higher than otherwise. When it is formed at around the middle, since the corresponding portion of the first conductive pattern 11 just has an area corresponding to the line width thereof, if the second resistor 16c is shifted in position, it may make contact with the adjacent first GND pattern 13 to cause a characteristic failure. Thus, the second resistor 16c requires a high manufacturing accuracy.

Figure 8:
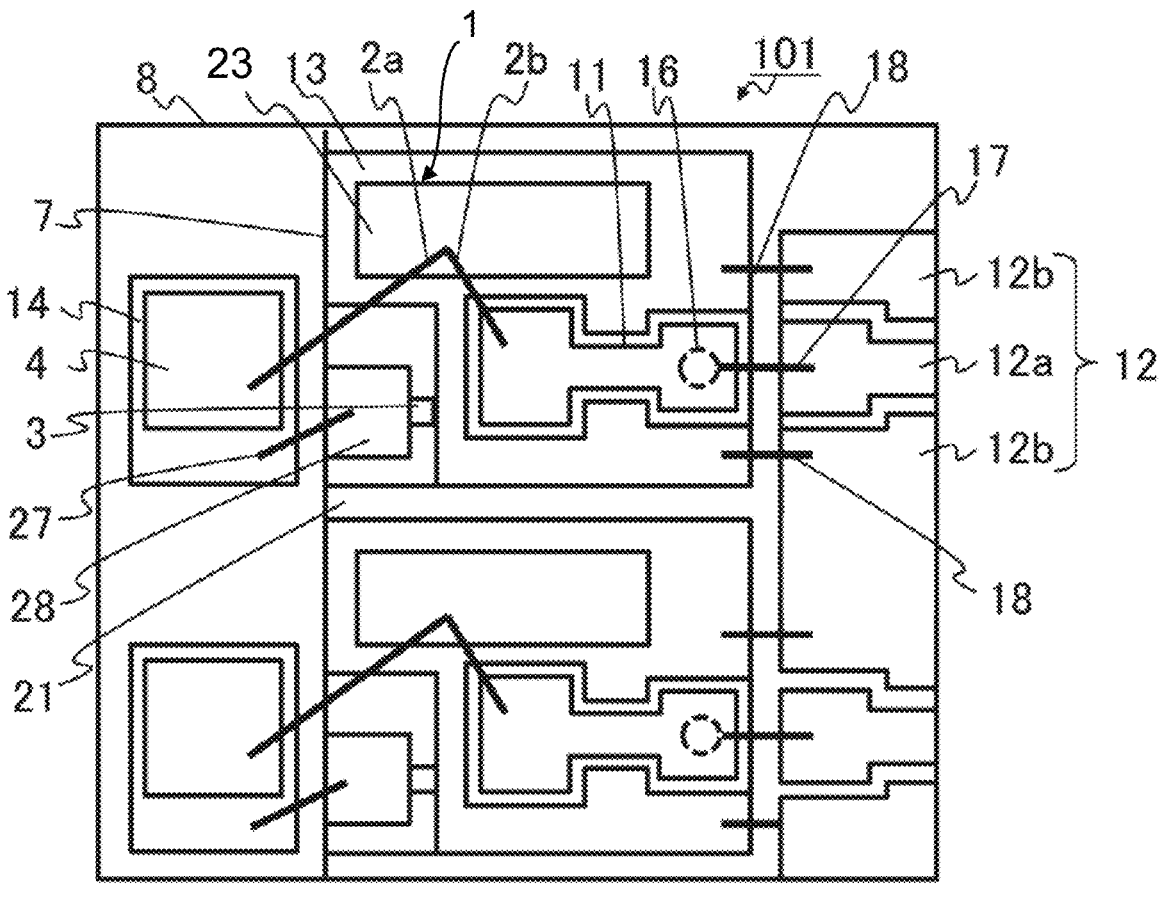
FIG. 8 is a plan view showing another configuration of the optical semiconductor device according to Embodiment 1.

It is noted that the capacitor 4 does not have to be located on the sub-mount board 7, and may be located on the carrier board 8. A configuration in which the capacitor 4 is located on the carrier board 8 is shown in FIG. 8. The carrier board 8 shown in FIG. 8 is, for example, made of AlN. On the carrier board 8, the conductive pattern 21 and the second conductive pattern 14 are provided. The back surface electrode (not illustrated) of the capacitor 4 and the second conductive pattern 14 are bonded to each other using a solder or the like. Here, since the back surface electrode of the capacitor 4 has to be separated from the GND patterns, the conductive pattern 21 and the second conductive pattern 14 have to be separated from each other. The front surface electrode (not illustrated) of the capacitor 4 and the upper surface electrode of the light-emitting element 1 are connected to each other using a wire 2a. On the sub-mount board 7, a conductive pattern 28 is provided. The conductive pattern 28 and the second conductive pattern 14 are connected to each other using a wire 27. When this configuration is employed, such an effect is provided that the sub-mount board 7 can be further small-sized.

Figure 9:
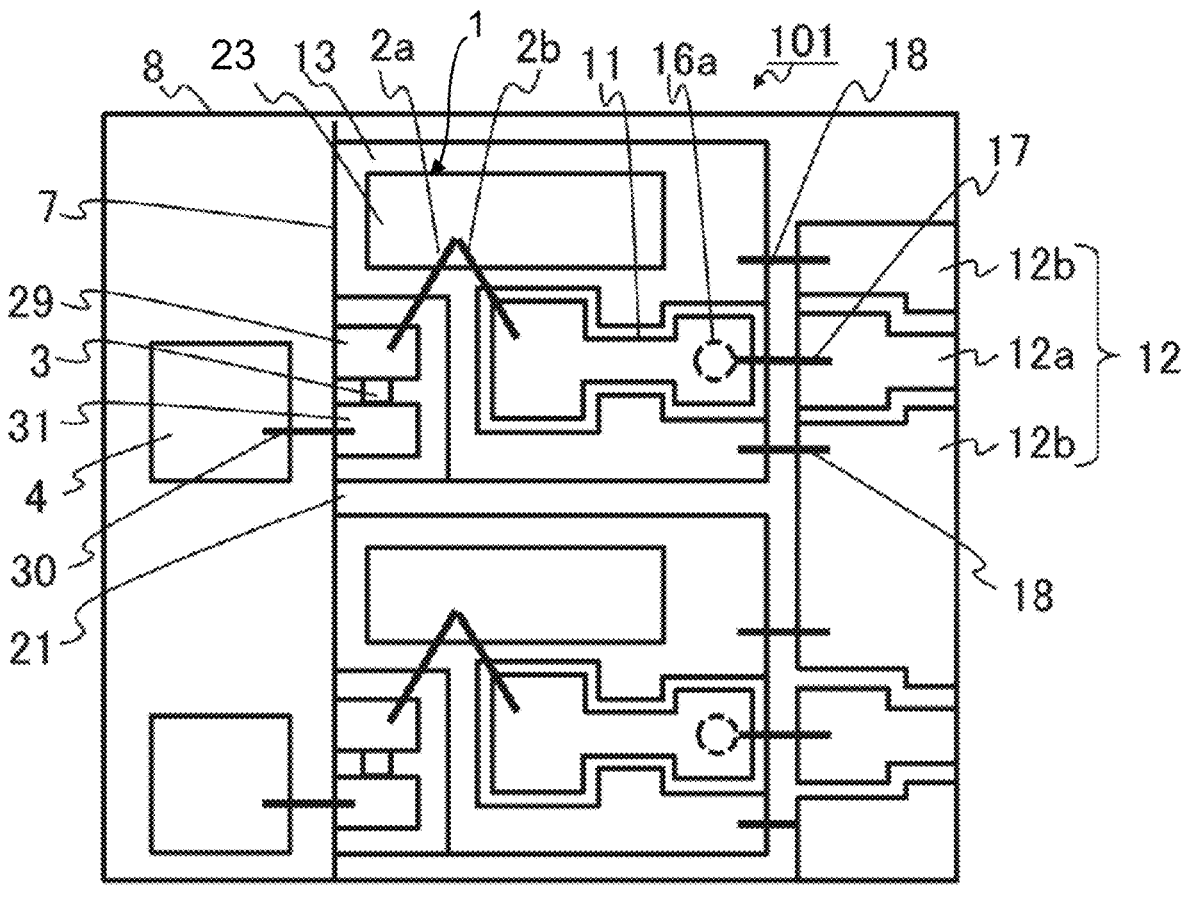
FIG. 9 is a plan view showing another configuration of the optical semiconductor device according to Embodiment 1.

Further, another configuration in which the capacitor 4 is located on the carrier board 8 is shown in FIG. 9. The carrier board 8 shown in FIG. 9 is, for example, made of CuW. The back surface electrode of the capacitor 4 and the conductive pattern 21 are bonded to each other using a solder or the like. On the sub-mount board 7, a conductive pattern 29, a conductive pattern 31 and the matching resistor 3 are provided, and the matching resistor 3 is connected between the conductive pattern 29 and the conductive pattern 31. The front surface electrode 23 of the light-emitting element 1 and the conductive pattern 29 are connected to each other using a wire 2a. The conductive pattern 31 and the front surface electrode (not illustrated) of the capacitor 4 are connected to each other using a wire 30. When this configuration is employed, such an effect is provided that the sub-mount board 7 can be further small-sized.

As described above, the optical semiconductor device 101 according to Embodiment 1 comprises: the sub-mount board 7 that is provided with, on its front surface, the first GND pattern 13, the first conductive pattern 11 and the second conductive pattern 14, and is provided with, on its back surface, the second GND pattern 19; the light-emitting element 1 that is bonded to the surface of the first GND pattern 13; the capacitor 4 whose back surface is bonded to the surface of the second conductive pattern 14, and whose front surface is connected through the wire 2a to the front surface electrode of the light-emitting element 1; the matching resistor 3 that makes a connection between the second conductive pattern 14 and the first GND pattern 13; and the protective resistor 6 that makes a connection between the first conductive pattern 11 and the second GND pattern 19 in a manner penetrating through the sub-mount board 7, said first conductive pattern being connected through the wire 2b to the front surface electrode of the light-emitting element 1; wherein the protective resistor 6 (second resistor 16a) is formed of a resistive material filled in a hole created in the sub-mount board 7. Thus, the sub-mount board can be small-sized while having the protective resistor.

Embodiment 2

In Embodiment 1, the protective resistor 6 is formed of a resistive material filled in the hole, whereas in Embodiment 2, a case will be described where it is instead formed of a resistive paste applied to the side wall of the hole.

Figure 10A:
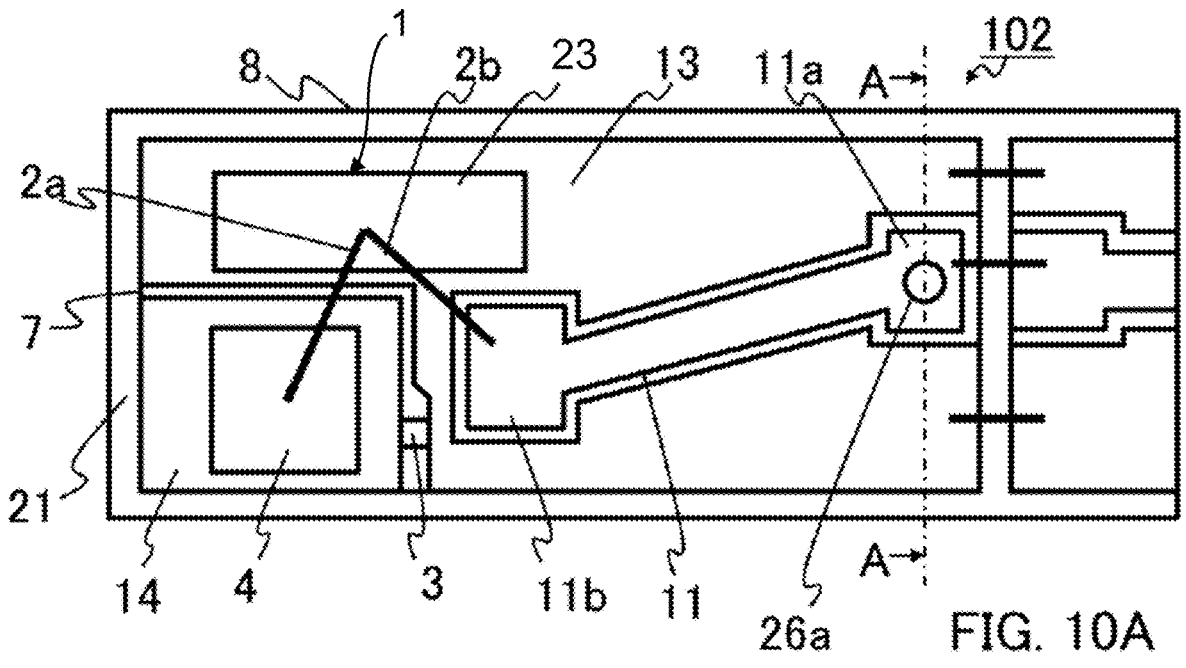
FIG. 10A and FIG. 10B are is a set of plan view and cross-sectional view showing a configuration of an optical semi-conductor device according to Embodiment 2.
Figure 10B:
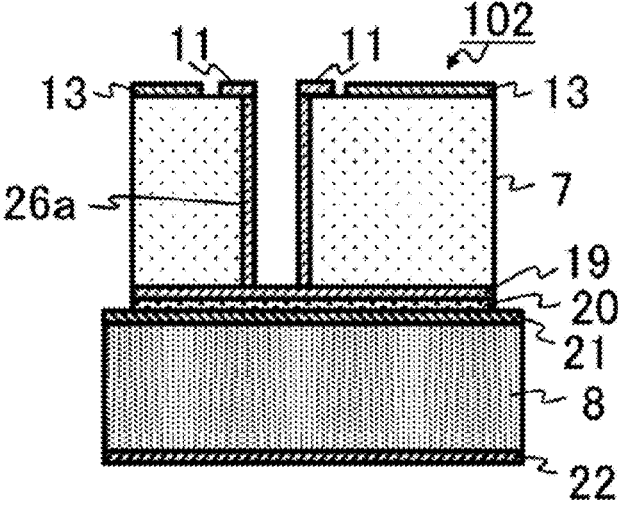

FIG. 10A and FIG. 10B are diagrams showing a configuration of an optical semiconductor device 102 according to Embodiment 2 of this application. FIG. 10A is a plan view and FIG. 10B is an AA arrow cross-sectional view in FIG. 10A.

The optical semiconductor device 102 according to Embodiment 2 of this application is characterized in that the protective resistor 6 is instead configured as a second resistor 26a that is formed of a resistive paste applied to the side wall of a hole created in a sub-mount board 7. As shown in FIG. 10A and FIG. 10B, in the optical semiconductor device 102, the second resistor 26a penetrates through the sub-mount board 7 to thereby make a connection between:

a terminal portion 11a for external connection in a first conductive pattern 11 that is connected through a wire 2b to the front surface electrode 23 of a light-emitting element 1, said terminal portion being located near a side surface of the sub-mount board 7; and a second GND pattern 19 formed on the back surface of the sub-mount board 7.

The other configuration of the optical semi-conductor device 102 according to Embodiment 2 is similar to that of the optical semiconductor device 101 according to Embodiment 1, so that, for the equivalent parts, the same reference numerals are applied and description thereof will be omitted.

Figure 11:
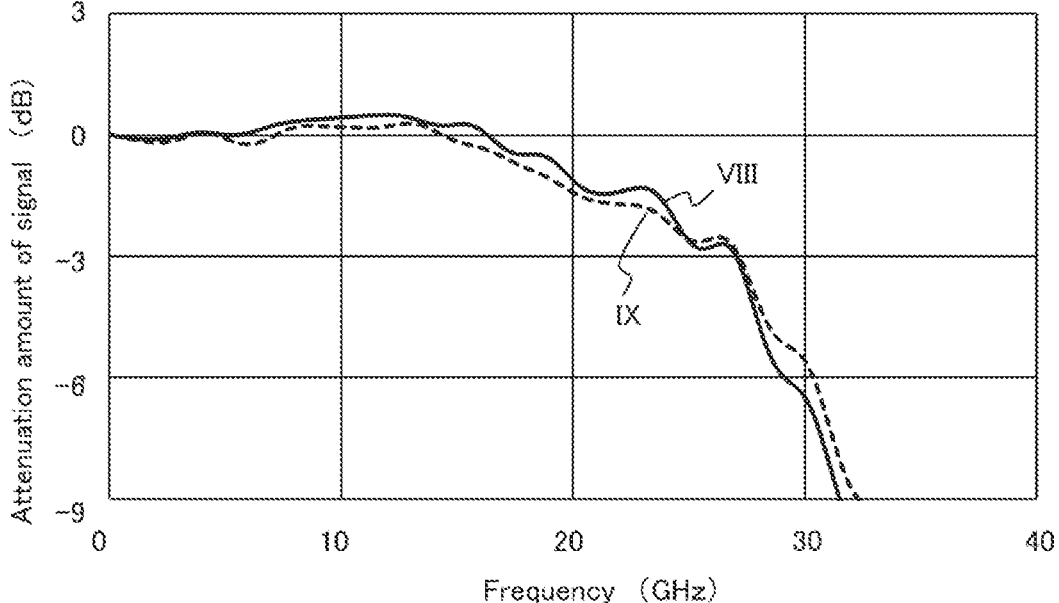
FIG. 11 is a graph showing a relationship between an attenuation amount and a frequency.

In Embodiment 2, the second resistor 26a is used as the protective resistor 6, so that, in FIG. 11, a simulation result is shown that represents a relationship between an attenuation amount of a signal and a frequency thereof when the resistance value of the resistive paste applied as the second resistor 26*a* is 0.1 kΩ. In this simulation, the resistance value of the matching resistor 3 was set to 50Ω and the capacitance of the capacitor 4 was set to 10 nF. The abscissa represents the frequency of a signal inputted to the optical semiconductor device 102. The ordinate represents the attenuation amount of the signal during its transfer by the optical semiconductor device 102. Line VIII represents a result in the case of the second resistor 26*a* of Embodiment 2, and Line IX represents a comparative result in the case of the second resistor 16*a* (whose resistance value is 0.1 kΩ) of Embodiment 1. As shown in FIG. 11, in addition to the effect due to the second resistor 16*a* of Embodiment 1, the second resistor 26*a* of Embodiment 2 provides such an effect that the characteristic is improved in a band range of 5 GHz to 25 GHz, because it has an inductance component thus causing peaking.

It is noted that, in Embodiment 2, the second resistor 26*a* is provided at the terminal portion 11*a* for external connection in the first conductive pattern 11; however, this is not limitative. It may instead be a second resistor 26*b* which is provided at a terminal portion 11*b* for connection to the light-emitting element 1. Further, it may instead be a second resistor 26*c* which is provided at an interconnection portion 11*c* in the first conductive pattern 11 between the terminal portion 11*b* for connection to the light-emitting element 1 and the terminal portion 11*a* for external connection. It is particularly noted that the terminal portions 11*a*, 11*b* for these connections, which constitute both ends of the first conductive pattern 11, each have an enlarged pattern area to create a capacitance component for cancelling out the inductance component of the wire. This makes it possible to easily establish the connection between the second resistor and the first conductive pattern 11, and thus an effect of improving ease of manufacture may also be achieved.

As described above, the optical semiconductor device 102 according to Embodiment 2 comprises: the sub-mount board 7 that is provided with, on its front surface, the first GND pattern 13, the first conductive pattern 11 and the second conductive pattern 14, and is provided with, on its back surface, the second GND pattern 19; the light-emitting element 1 that is bonded to the surface of the first GND pattern 13; the capacitor 4 whose back surface is bonded to the surface of the second conductive pattern 14, and whose front surface is connected through the wire 2*a* to the front surface electrode of the light-emitting element 1; the matching resistor 3 that makes a connection between the second conductive pattern 14 and the first GND pattern 13; and the protective resistor 6 that makes a connection between the first conductive pattern 11 and the second GND pattern 19 in a manner penetrating through the sub-mount board 7, said first conductive pattern being connected through the wire 2*b* to the front surface electrode of the light-emitting element 1; wherein the protective resistor 6 (second resistor 26*a*) is formed of a resistive paste applied to the side wall of a hole created in the sub-mount board 7. Thus, the sub-mount board can be small-sized while having the protective resistor.

Embodiment 3

In Embodiment 1 and Embodiment 2, the protective resistor 6 is formed to penetrate through the sub-mount board 7, whereas in Embodiment 3, a case will be described where it is formed along a side surface of the sub-mount board 7.

Figure 12A:
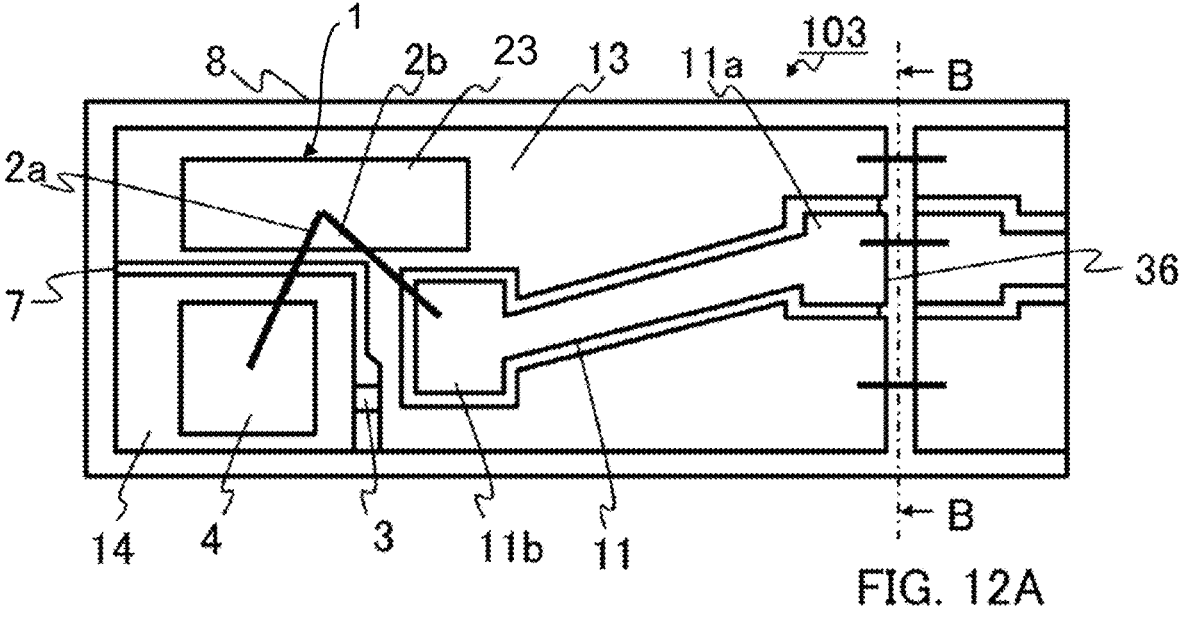
FIG. 12A and FIG. 12B are is a set of plan view and side view showing a configuration of an optical semiconductor device according to Embodiment 3.
Figure 12B:
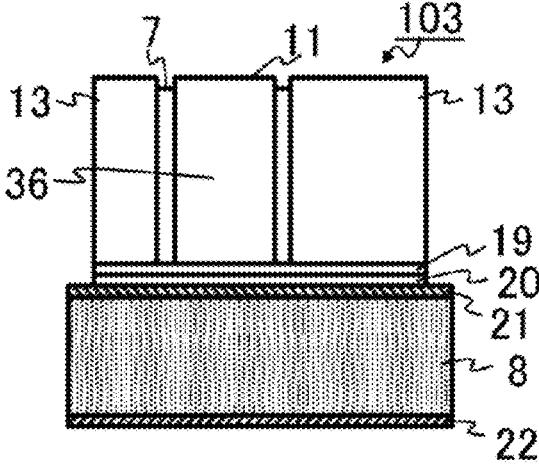

FIG. 12A and FIG. 12B are diagrams showing a configuration of an optical semiconductor device 103 according to Embodiment 3 of this application. FIG. 12A is a plan view and FIG. 12B is a BB arrow side view in FIG. 12A.

The optical semiconductor device 103 according to Embodiment 3 of this application is characterized in that the protective resistor 6 is instead configured as a second resistor 36 that is formed of a metallization layer provided on a side surface of the sub-mount board 7. As shown in FIG. 12A and FIG. 12B, in the optical semiconductor device 103, the second resistor 36 makes a connection, along the side surface of the sub-mount board 7, between:

a terminal portion 11*a* for external connection in a first conductive pattern 11 that is connected through a wire 2*b* to the front surface electrode 23 of a light-emitting element 1, said terminal portion being located near the side surface of the sub-mount board 7; and a second GND pattern 19 formed on the back surface of the sub-mount board 7.

The other configuration of the optical semi-conductor device 103 according to Embodiment 3 is similar to that of the optical semiconductor device 101 according to Embodiment 1, so that, for the equivalent parts, the same reference numerals are applied and description thereof will be omitted.

As described above, the optical semiconductor device 103 according to Embodiment 3 comprises: the sub-mount board 7 that is provided with, on its front surface, the first GND pattern 13, the first conductive pattern 11 and the second conductive pattern 14, and is provided with, on its back surface, the second GND pattern 19; the light-emitting element 1 that is bonded to the surface of the first GND pattern 13; the capacitor 4 whose back surface is bonded to the surface of the second conductive pattern 14, and whose front surface is connected through the wire 2*a* to the front surface electrode of the light-emitting element 1; the matching resistor 3 that makes a connection between the second conductive pattern 14 and the first GND pattern 13; and the protective resistor 6 that makes a connection, along a side surface of the sub-mount board 7, between the first conductive pattern 11 and the second GND pattern 19, said first conductive pattern being connected through the wire 2*b* to the front surface electrode of the light-emitting element 1; wherein the protective resistor 6 (second resistor 36) is formed of a metallization layer provided on the side surface of the sub-mount board 7. Thus, the sub-mount board can be small-sized while having the protective resistor. Further, since the second resistor 36 is provided on the side surface, irregularities due to a metallization pattern will not occur on the first conductive pattern 11 and thus, an effect of improving ease of manufacture at the time of wire connection may also be achieved.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where at least one configuration element is added or omitted; and furthermore, where at least one configuration element is extracted and combined with a configuration element of another embodiment.

DESCRIPTION OF REFERENCE NUMERALS
AND SIGNS

1: light-emitting element, 2a, 2b: wire, 3: matching resistor, 4: capacitor, 6: protective resistor, 7: sub-mount board, 11: first conductive pattern, 13: first GND pattern, 14: second conductive pattern, 16a, 16b, 16c: second resistor, 19: second GND pattern, 26a, 26b, 26c: second resistor, 36: second resistor, 101, 102, 103: optical semiconductor device.

The invention claimed is:

1. An optical semiconductor device, comprising:
a board that is provided with, on its front surface, a first GND pattern, a first conductive pattern and a second conductive pattern, and is provided with, on its back surface, a second GND pattern;
a light-emitting element that is bonded to a surface of the first GND pattern;
a capacitor whose back surface is bonded to a surface of the second conductive pattern, and whose front surface is connected through a first wire to a front surface electrode of the light-emitting element;
a first resistor that makes a connection between the second conductive pattern and the first GND pattern; and
a second resistor that makes a connection between the first conductive pattern and the second GND pattern across the board in a board thickness direction, said first conductive pattern being connected through a second wire to the front surface electrode of the light-emitting element.

2. The optical semiconductor device of claim 1, wherein the second resistor makes the connection in a manner penetrating through the board.

3. The optical semiconductor device of claim 2, wherein the second resistor is formed of a resistive material that is filled in a hole created in the board.

4. The optical semiconductor device of claim 2, wherein the second resistor is formed of a resistive material that is applied to a side wall of a hole created in the board.

5. The optical semiconductor device of claim 3, wherein the second resistor is connected to a terminal portion for external connection in the first conductive pattern.

6. The optical semiconductor device of claim 3, wherein the second resistor is connected to a terminal portion for connection in the first conductive pattern at which the first conductive pattern is connected to the front surface electrode of the light-emitting element.

7. The optical semiconductor device of claim 3, wherein the second resistor is connected to an interconnection portion in the first conductive pattern between its terminal portion for external connection and the front surface electrode of the light-emitting element.

8. The optical semiconductor device of claim 1, wherein the second resistor makes the connection along a side surface of the board.

9. The optical semiconductor device of claim 8, wherein the second resistor is formed of a metallization layer provided on the side surface of the board.

10. The optical semiconductor device of claim 1, wherein the second resistor has a resistance value of 0.3 kΩ or more.

11. The optical semiconductor device of claim 4, wherein the second resistor is connected to a terminal portion for external connection in the first conductive pattern.

12. The optical semiconductor device of claim 4, wherein the second resistor is connected to a terminal portion for connection in the first conductive pattern at which the first conductive pattern is connected to the front surface electrode of the light-emitting element.

13. The optical semiconductor device of claim 4, wherein the second resistor is connected to an interconnection portion in the first conductive pattern between its terminal portion for external connection and the front surface electrode of the light-emitting element.

14. The optical semiconductor device of claim 2, wherein the second resistor has a resistance value of 0.3 kΩ or more.

15. The optical semiconductor device of claim 3, wherein the second resistor has a resistance value of 0.3 kΩ or more.

16. The optical semiconductor device of claim 4, wherein the second resistor has a resistance value of 0.3 kΩ or more.

*     *     *     *     *